United States Patent
Gektin et al.

(10) Patent No.: US 10,418,829 B2
(45) Date of Patent: Sep. 17, 2019

(54) CHARGER HAVING RETRACTABLE COOLING SURFACE

(71) Applicant: Futurewei Technologies, Inc., Plano, TX (US)

(72) Inventors: Vadim Gektin, San Jose, CA (US); Quanming Li, Santa Clara, CA (US); Guo Yang, Santa Clara, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/409,212

(22) Filed: Jan. 18, 2017

(65) Prior Publication Data

US 2018/0205245 A1     Jul. 19, 2018

(51) Int. Cl.
| | |
|---|---|
| *H02J 7/00* | (2006.01) |
| *H01R 24/68* | (2011.01) |
| *H05K 7/20* | (2006.01) |
| *H01R 103/00* | (2006.01) |

(52) U.S. Cl.
CPC ............ *H02J 7/0042* (2013.01); *H01R 24/68* (2013.01); *H05K 7/20418* (2013.01); *H01R 2103/00* (2013.01)

(58) Field of Classification Search
USPC ........................................................ 320/107
See application file for complete search history.

(56) References Cited

U.S. PATENT DOCUMENTS

| | | | | |
|---|---|---|---|---|
| 2009/0240411 | A1* | 9/2009 | Amamiya | B60W 30/18063 701/70 |
| 2012/0098494 | A1* | 4/2012 | Ogura | H01M 10/46 320/112 |
| 2013/0069591 | A1* | 3/2013 | Iyasu | H02J 7/1461 320/109 |
| 2015/0084591 | A1* | 3/2015 | Kishima | H02J 7/0013 320/112 |
| 2015/0288187 | A1* | 10/2015 | Poitrast | H01L 35/32 700/295 |
| 2017/0063137 | A1* | 3/2017 | Sultenfuss | H02J 7/025 |
| 2017/0207829 | A1* | 7/2017 | Morris | H04B 7/0413 |

FOREIGN PATENT DOCUMENTS

| | | |
|---|---|---|
| CN | 102650396 A | 8/2012 |
| CN | 203325888 U | 12/2013 |
| CN | 204013193 U | 12/2014 |
| CN | 205869664 U | 1/2017 |
| JP | 04-276699 A | 10/1992 |

OTHER PUBLICATIONS

"International Application Serial No. PCT/CN2017/108193, International Search Report dated Feb. 6, 2018", 6 pgs.
"International Application Serial No. PCT/CN2017/108193, Wriiten Opinion dated Feb. 6, 2018", 4 pgs.

\* cited by examiner

*Primary Examiner* — Mohammed Alam
(74) *Attorney, Agent, or Firm* — Schwegman Lundberg & Woessner, P.A.

(57) ABSTRACT

A device includes a charger case. Charging electronics are supported within the case. An electrical connector is coupled to the charging electronics for coupling to a power source. A cooling element is coupled to the charger case and extendable to an extended position from the case such that a cooling surface area of the charger case is increased.

14 Claims, 8 Drawing Sheets

CHARGER HAVING RETRACTABLE COOLING SURFACE

TECHNICAL FIELD

The present disclosure is related to chargers, and in particular to a charger having one or more retractable cooling surfaces to provide additional cooling for charging circuitry.

BACKGROUND

Mobile electronic equipment, such as smart phones and other devices, commonly includes batteries that need recharging. One desirable feature is the ability to quickly recharge such batteries. Chargers have been developed that deliver charges faster, but also generate more heat that must be dissipated to keep the charger operating within specified temperature limits.

SUMMARY

A charger includes a charger case and charging electronics that are supported within the case. An electrical connector is coupled to the charging electronics for coupling the charger to a power source. An extendable cooling element is mechanically and thermally coupled to the charger case and is extendable to an extended position from the case such that a cooling surface area of the charger case is increased.

An alternative device includes a charger case. Charging electronics are supported within the case. An electrical connector is coupled to the charging electronics and positioned on a first end of the charger case configured to couple to a power socket to access a power source. A cooling element is coupled to the charger case and extendable from a retracted position to an extended position while the charger case is coupled to the power source.

A method includes forming a battery charger case with a collapsible cooling surface, wherein the cooling surface is coupled to the case having a retracted position and an extended position and forming a trigger coupled to the charger case and the cooling surface to controllably move the collapsible cooling surface between a retracted position and an extended position.

A device includes a charger case, charging electronics supported within the case, an electrical connector coupled to the charging electronics and positioned on a first end of the charger case for coupling to power socket to access a power source, and means for increasing a cooling surface area of the charger case.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of the example embodiments is, therefore, not to be taken in a limited sense, and the scope of the present invention is defined by the appended claims.

Mobile electronic equipment, such as smart phones and other devices, commonly includes batteries that need recharging. One desirable feature is the ability to quickly recharge such batteries. Chargers have been developed that deliver charges faster while also generating more heat. It is desirable to dissipate the heat to keep the charger operating within specified temperature limits to keep the chargers from reaching heating limits without increasing the size of such chargers and without adding active cooling features that can be expensive.

In various embodiments, a charger has one or more surfaces that can be extended from a retracted position to increase the passive cooling capacity of the charger. The surfaces can be hinged and rotated about the hinge away from a surface of the charger, or disposed in a slot and extended from the slot like a switchblade to increase the surface area for cooling. In either case, the extendable surfaces are thermally coupled to the charger case to facilitate charger cooling. A trigger may be mechanically actuated by plugging the charger into a power source, or electrically actuated responsive to the charger being connected to a power source to prompt the extendable surface to extend from the charger. The extendable surfaces may be spring loaded to actuate upon actuation of the trigger. The ability to provide additional cooling capacity without increasing the volume of the charger allows the trend of faster charging to continue without the additional expense of active cooling.

Figure 1:
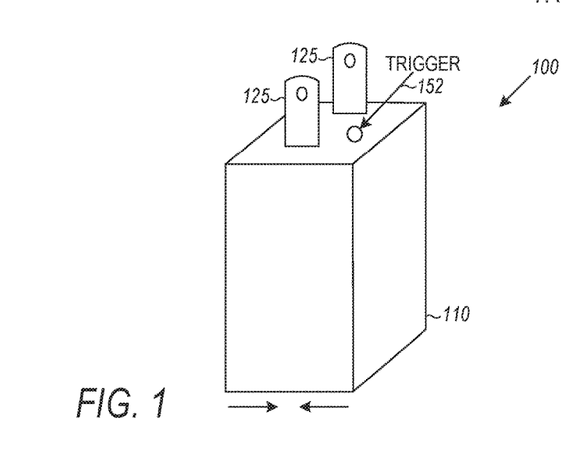
FIG. 1 is a perspective view of charger having retracted cooling surfaces according to an example embodiment.
Figure 2:
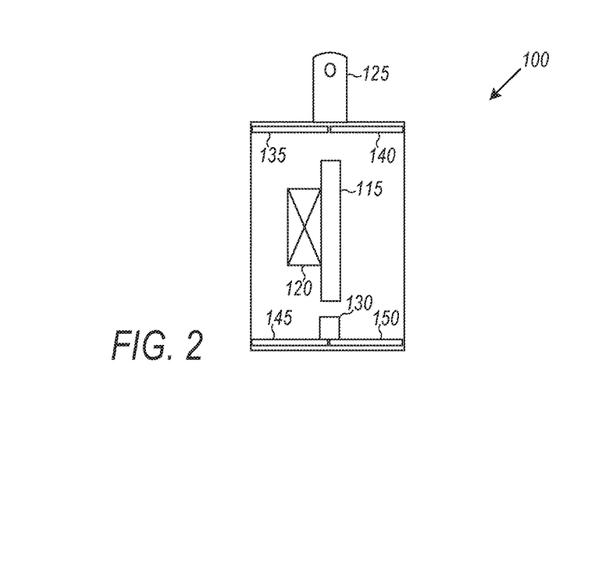
FIG. 2 is a cross section view of the charger of FIG. 1 according to an example embodiment.
Figure 3:
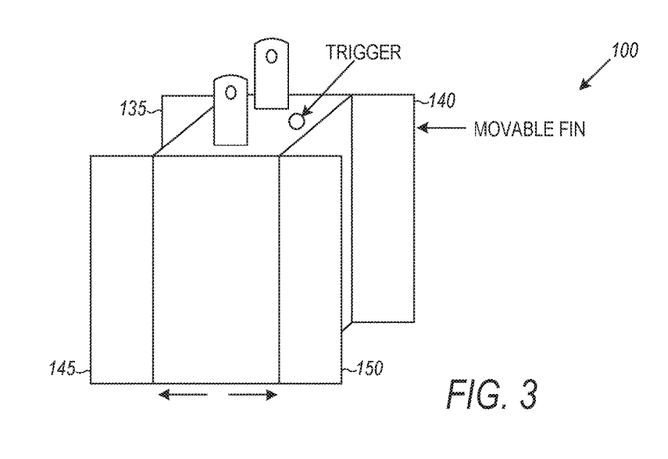
FIG. 3 is a perspective view of charger having extended cooling surfaces according to an example embodiment.
Figure 4:
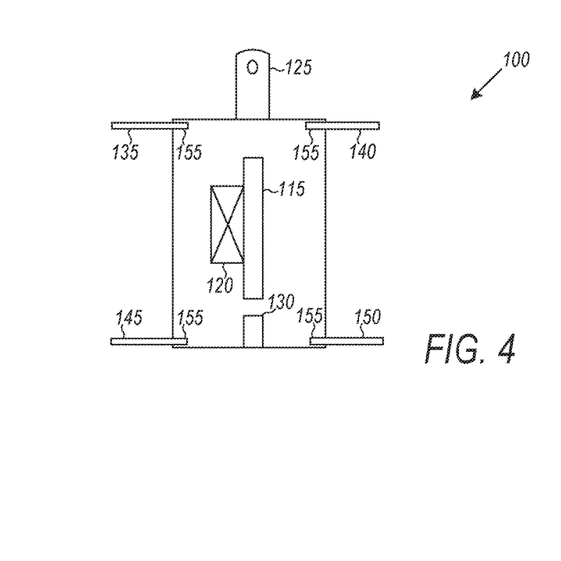
FIG. 4 is a cross section view of the charger of FIG. 3 according to an example embodiment.

FIGS. 1, 2, 3, and 4 are different views of a charger 100 with consistent reference numbers. FIG. 1 is a perspective view of charger 100. Charger 100 is also shown in cross section in FIG. 2. Charger 100 includes a charger case 110 that encapsulates and supports a circuit support 115 with charging circuitry 120. The charging circuitry 120 may be electrically coupled to charge connectors 125, such as electrical connectors for coupling to a standard outlet providing electricity to the charger 100. The charge connectors 125 are shown configured for one country's electrical outlets (e.g., U.S.A.), but it should be understood that there are many outlet and plug configurations in different countries and that the embodiments of the invention may readily be modified to include such variations.

In one embodiment, charger 100 is a universal serial bus (USB) type of charger with a USB connector 130 for charging portable electronics such as phones, tablets, personal digital assistants, etc. The charger 100 is suitable for recharging batteries via the USB connector 130 or powering one or more devices via the same connector 130. As faster charging rates are desired by consumers, it is desired to provide even more current at present charger voltages, or higher voltages at present charger currents, or a combination of both higher currents at higher voltages, each of which increases the amount of power delivered to charge and the associated heat. To passively dissipate more heat, charger 100 may include multiple additional cooling surfaces 135, 140, 145, and 150 that are shown in a retracted position in FIG. 2 and in an extended position in FIG. 4. The cooling surfaces reside within corresponding slots in the container 110 such that in the retracted position, a total volume of the charger 100 is not increased. A trigger 152 may be positioned on the case 110 and may be pressed by a user or by the act of plugging charger 100 into an outlet, to release the cooling surfaces from their retracted positions as indicated in perspective view in FIG. 3. Trigger 152 in one embodiment is configured to extend the cooling element when actuated. The trigger 152 may be supported by the case 110 such that coupling the connector 130 to a current power source, such as an alternating current power source, actuates the trigger to extend the cooling element.

In one embodiment, the cooling surfaces 135, 140, 145, and 150 are planar rectangular surfaces forming fins that when extended from the charger case 110, extend orthogonal to the charger case 110 and increase the overall surface area of the charger case 110, facilitating increased heat dissipation by both radiation and passive convection. In one embodiment, the cooling surfaces 135, 140, 145, and 150 are made of a heat conducting material such as metal, and are thermally coupled to the case 110 to conduct heat away from the charger case 110. Thermal coupling occurs at least where a portion 155 of the cooling surfaces 135, 140, 145, and 150 are adjacent the case 110 such that heat transfer can occur as seen best in cross section in FIG. 4. For example, portion 155 is touching or nearly touching case 110 such that heat transfer may occur.

Figure 5:
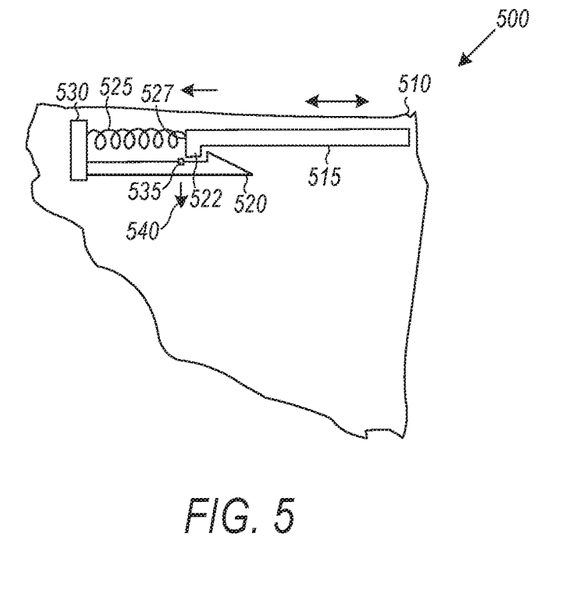
FIG. 5 is a cutaway view illustrating an example structure and operation of an example trigger according to an example embodiment.

FIG. 5 is a cutaway view 500 illustrating an example structure and operation of an example trigger. A charger case 510 is shown with a cooling surface 515 disposed in a retracted position within a slot in the charger case 510. A latch 520 is engaged with a protrusion 522 on the cooling surface 515, keeping the cooling surface in the retracted position. A spring indicated at 525 is coupled to an internal end 527 of the cooling surface 515 and is also coupled to a bulkhead 530, which provides a non-moving portion against which the spring 525 is biased to force the cooling surface 515 into an extended position responsive to the latch being unengaged with the protrusion 522.

The trigger, shown in cross section at 535, is used to move the latch 520 away from the protrusion 522 as indicated by arrow 540, releasing the cooling surface 510 such that the spring 525 forces the cooling surface 510 into an extended position. Pushing the cooling surface back into the case 510 without depressing the trigger, enables the latch 520 to reengage with the protrusion 522 and hold the cooling surface back in the retracted position.

Figure 6:
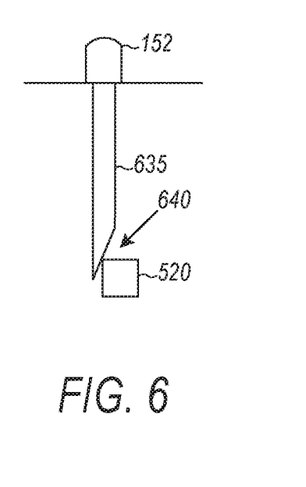
FIG. 6 is a cross section view of the trigger of FIG. 5 according to an example embodiment.

FIG. 6 is a cross section illustrating trigger 152 in further detail. Trigger 152 in one embodiment includes a shaft 635 with an angled cam portion 640 that operations to push latch 520 in the direction of arrow 540 when the trigger is actuated, such as by depressing the trigger. In one embodiment, shaft 635 is axially perpendicular to latch 520 to push latch 520 in direction 540. It can be visualized as extending down from above the view in FIG. 5, and when depressed, pushes the latch 520 in the direction 540 to release the cooling surface 515 such that it extends from the case 510.

FIGS. 5 and 6 illustrate one example embodiment of a trigger. Many other mechanical structures may be used to releasably hold one or more cooling surfaces in place may be used. In further embodiments, electronically controlled actuators may be utilized that are actuated by mechanical trigger or electronics 120 responsive to a trigger being pressed or power being received from connectors 125. The actuators may be controlled based on an amount of current being provided in further embodiments.

Figure 7:
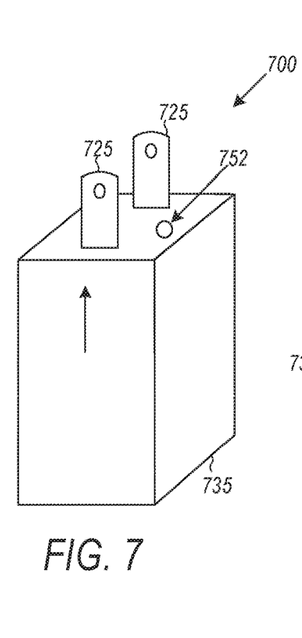
FIG. 7 is a perspective view of charger having retracted cooling surfaces according to an example embodiment.

FIGS. 7, 8, 9, and 10 are different views of a charger 700 with consistent reference numbers. FIG. 7 is a perspective view of charger 700. Charger 700 is also shown in cross section in FIG. 8. Charger 700 includes a charger case 710 that encapsulates and supports a circuit support 715 with charging circuitry 720. The charging circuitry 720 may be electrically coupled to connectors 725, such as electrical connectors for coupling to a standard outlet providing electricity to the charger 700. The connectors 725 are shown configured for one country's electrical outlets, but are a block representation of multiple configurations suitable for outlets in many different countries.

In one embodiment, charger 700 is a universal serial bus (USB) type of charger with a USB connector 730. The charger 700 is suitable for recharging batteries via the USB connector 730 or powering one or more devices via the same connector 730.

Figure 8:
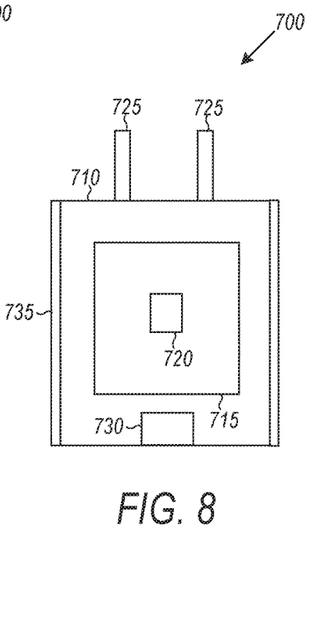
FIG. 8 is a cross section view of the charger of FIG. 7 according to an example embodiment.
Figure 9:
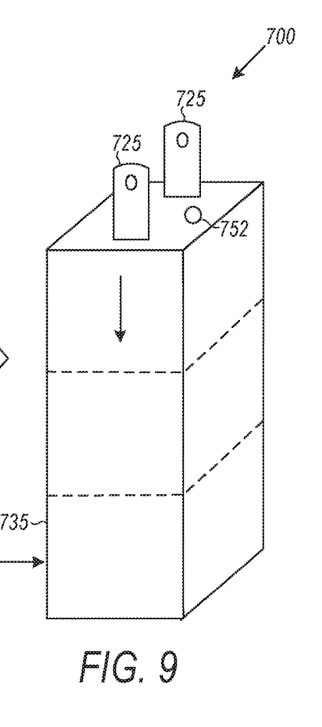
FIG. 9 is a perspective view of charger having extended cooling surfaces according to an example embodiment.
Figure 10:
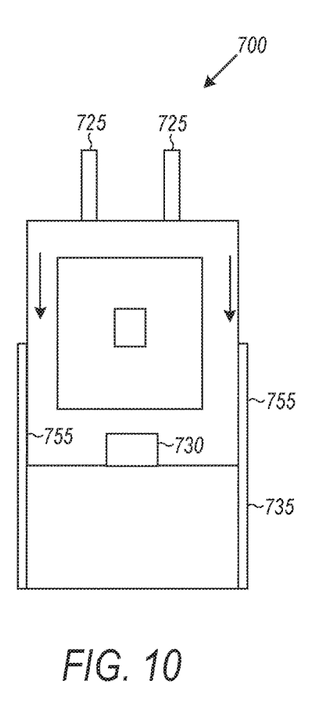
FIG. 10 is a cross section view of the charger of FIG. 9 according to an example embodiment.

To passively dissipate more heat, charger 700 may include an additional cooling surface 735 indicated in a retracted position in FIGS. 7 and 8. In one embodiment, the cooling surface 735 is a sleeve, extending around four sides of case 710. A trigger 752 may be positioned on the container 710 and may be pressed by a user or by the act of plugging charger 700 into an outlet, to release the cooling surface from a retracted position as indicated in perspective view in FIG. 9 and cross section of FIG. 10.

In one embodiment, the cooling surface 735 is formed of coupled rectangular surfaces forming a sleeve that fits over the container 710. In one embodiment, the sleeve forms a light friction fit such that it remains retracted until extended by operation of the trigger 752 or when manually pulled into the extended position. The cooling surface 735 extends orthogonal to an end of the charger case 710 and increases the overall surface area of the charger case 710, facilitating increased heat dissipation by both radiation and passive convection. In one embodiment, the cooling surface 735 is made of a heat conducting material such as metal, and is thermally coupled to the case 710 to conduct heat away from the charger case 710 via the friction fit. Thermal coupling occurs at least where a portion 755 of the cooling surface 735 remains adjacent the case 710 as seen best in cross section in FIG. 10. A total volume of the charger case 710 may not be significantly changed between the retracted and extended positions of the cooling surface 735, while a total surface area is changed.

Figure 11:
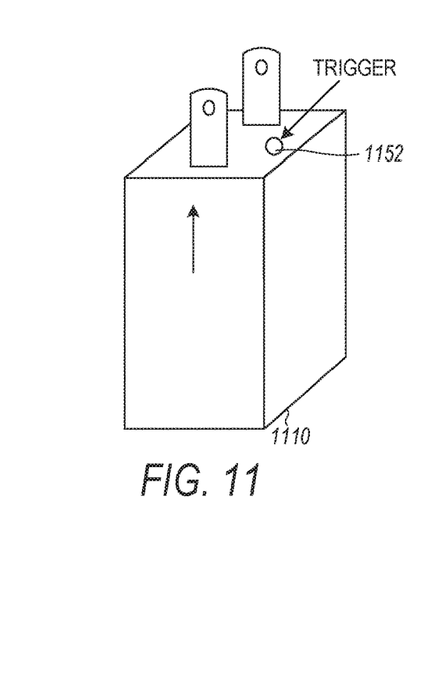
FIG. 11 is a perspective view of charger having retracted cooling surfaces according to an example embodiment.

FIGS. 11, 12, 13, and 14 are different views of a charger 1100 with consistent reference numbers. FIG. 11 is a perspective view of charger 1100. Charger 1100 is also shown in cross section in FIG. 12. Charger 1100 includes a charger case that encapsulates and supports a circuit support with charging circuitry. The charging circuitry may be electrically coupled to connectors 1125, such as electrical connectors for coupling to a standard outlet providing electricity to the charger 1100. The connectors 1125 are shown configured for one country's electrical outlets, but are a block representation of multiple configurations suitable for outlets in many different countries.

In one embodiment, charger 1100 is a universal serial bus (USB) type of charger with a USB connector 1130. The charger 1100 is suitable for recharging batteries via the USB connector 1130 or powering one or more devices via the same connector 1130.

Figure 12:
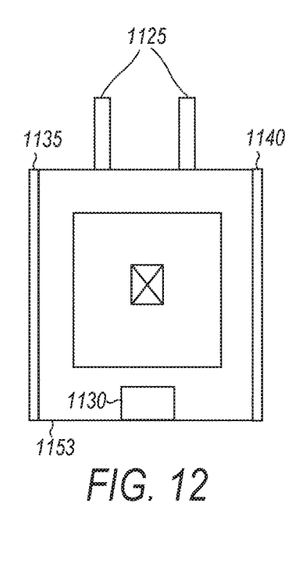
FIG. 12 is a cross section view of the charger of FIG. 11 according to an example embodiment.
Figure 13:
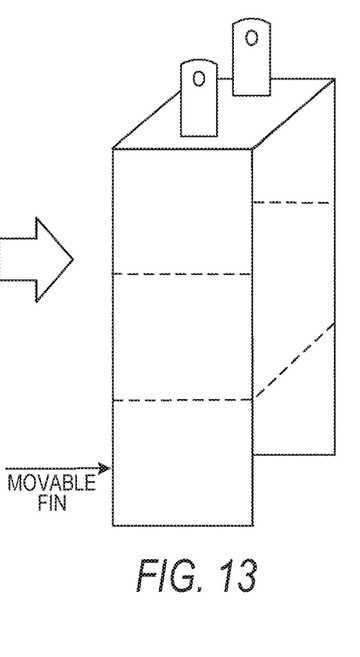
FIG. 13 is a perspective view of charger having extended cooling surfaces according to an example embodiment.
Figure 14:
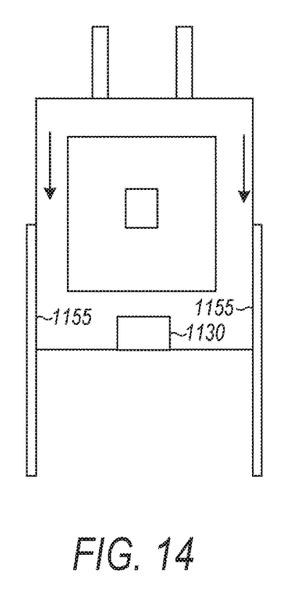
FIG. 14 is a cross section view of the charger of FIG. 13 according to an example embodiment.

To passively dissipate more heat, charger 1100 may include multiple additional cooling surfaces 1135 and 1140 indicated in a retracted position in FIG. 12. The cooling surfaces reside within corresponding slots in the container 1110 such that in the retracted position, a total volume of the charger 1100 is not increased. A trigger 1152 may be positioned on the container 1110 and may be pressed by a user or by the act of plugging charger 1100 into an outlet, to release the cooling surfaces from their retracted positions as indicated in perspective view in FIG. 13.

In one embodiment, the cooling surfaces 1135 and 1140 are planar rectangular surfaces forming fins that when extended from the charger case 1110, extend away from the charger case 1110, orthogonal to an end 1153 opposite an end having connectors 1125. The cooling surfaces in the extended position increase the overall surface area of the charger case 1110, facilitating increased heat dissipation by both radiation and passive convection. In one embodiment, the cooling surfaces 1135 and 1140 are made of a heat conducting material such as metal, and are thermally coupled to the case 1110 to conduct heat away from the charger case 1110. Thermal coupling occurs at least where a portion 1155 of the cooling surfaces 1135 and 1140 are adjacent and touching or nearly touching the case 1110 as seen best in cross section in FIG. 14 such that heat transfer occurs.

In different embodiments, the cooling surfaces 135, 140, 145, and 150 may be used with cooling surfaces 1135 and 1140, or any combination of the cooling surfaces may be used to obtain a desired increase in cooling surface area. One or more of the various cooling surfaces comprise means for increasing a cooling surface area of the charger case. In some embodiments, the structure for increasing the cooling surface area may include one or more of the trigger, hinge, and spring arrangements which operate to extend the cooling surfaces.

Figure 15:
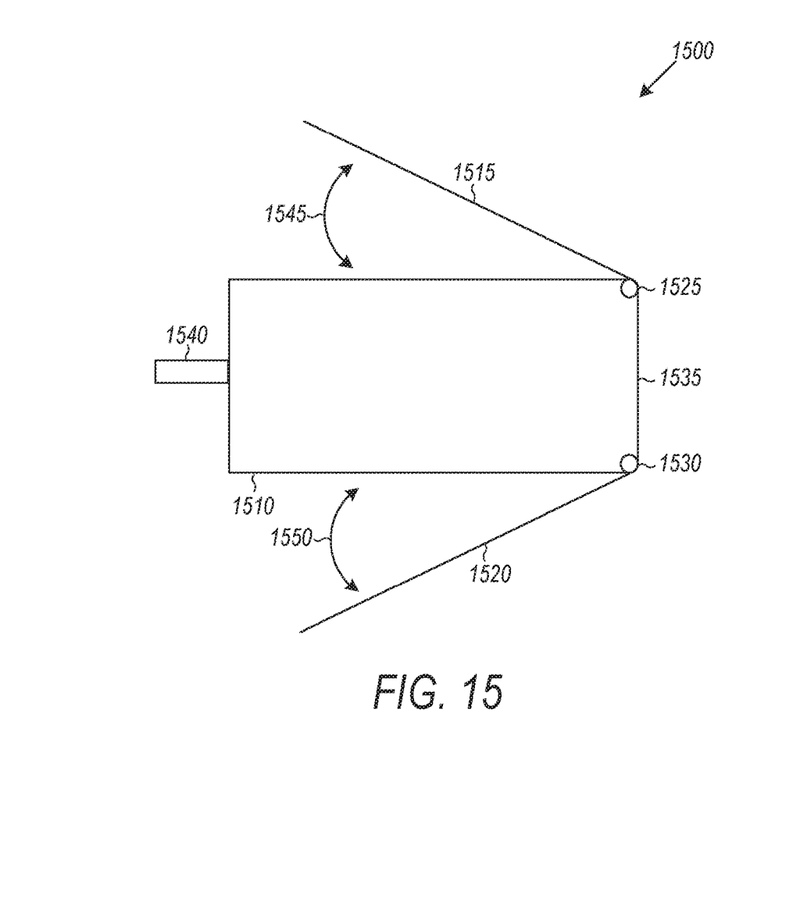
FIG. 15 is a side view representation of an alternative charger having a charger case and two extendable cooling surfaces on opposite sides of the charger case according to an example embodiment.

FIG. 15 is a side view representation of an alternative charger 1500 having a charger case 1510 and two extendable cooling surfaces 1515 and 1520. Cooling surfaces 1515 and 1520 are planar in shape in one embodiment, and may be coupled to the case 1510 via respective hinges 1525 and 1530. The hinges 1525 and 1530 may be disposed at an end 1535 of the case 1510 that is opposite an end having connectors 1540. The hinges 1525 allow rotation of the cooling surfaces from a retracted position to an extended position about the hinges as represented by arrows 1545 and 1550. The angle of the cooling surfaces from respective surfaces of the case 1510 may vary from zero in the retracted position to 90 degrees or more. When in the retracted position, the cooling surfaces 1515 and 1520 are coplanar and adjacent to the respective surfaces of the charger case 1510.

In one embodiment, the hinges 1525 and 1530 provide thermal coupling between the cooling surfaces and the charger case 1510. The hinges may be formed of a thermally conductive metal or other material and may extend along the entire hinged portion of the cooling surfaces to provide sufficient thermal coupling to facilitate suitable heat transfer.

Figure 16:
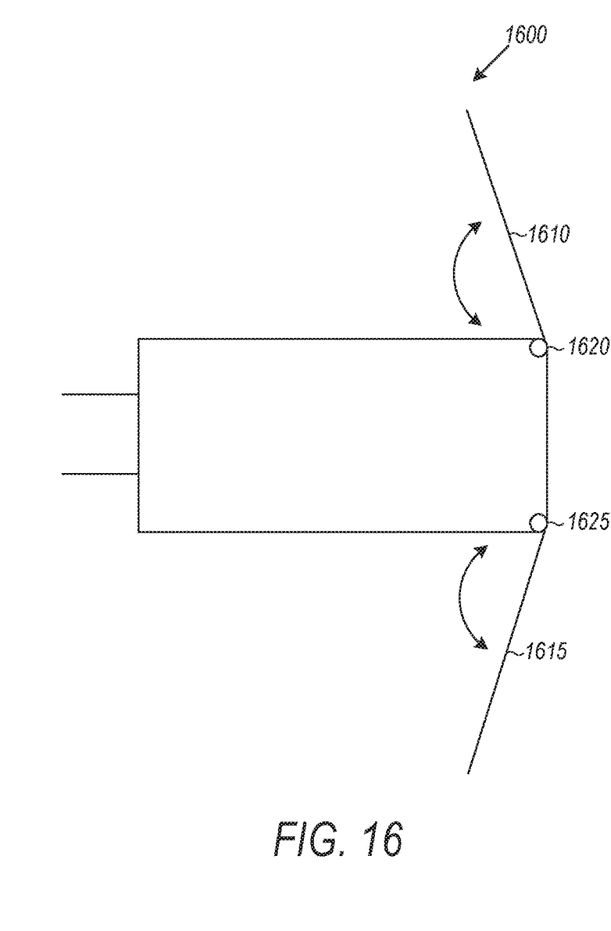
FIG. 16 is a side view representation of an alternative charger having a charger case and two extendable cooling surfaces on opposite sides of the charger case according to an example embodiment.

FIG. 16 is a top view of a charger 1600 showing additional cooling surfaces 1610 and 1615 coupled via hinges 1620 and 1625 that are also extendible by rotation as indicated by arrows 1630 and 1635. The cooling surfaces 1610 and 1615 may be included with cooling surfaces 1515 and 1520. Some embodiments may include either cooling surfaces 1515 and 1520 or cooling surfaces 1610 and 1615. The hinges may be spring loaded such that when cooling surfaces are released from an optional latch structure, the cooling surfaces spring open to a fixed or adjustable position.

Figure 17:
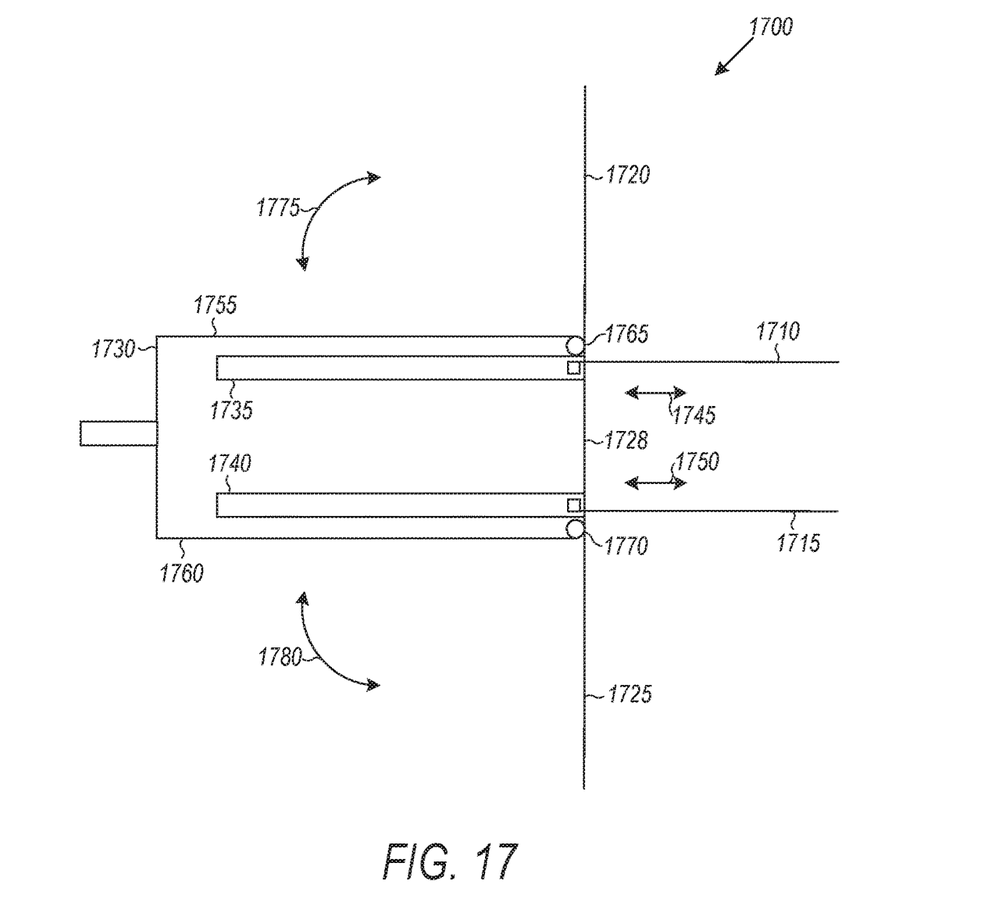
FIG. 17 is a side view representation of a charger illustrating a combination of different types of cooling surfaces according to an example embodiment.

FIG. 17 is a side view representation of a charger 1700 illustrating a combination of different types of cooling surfaces 1710, 1715, 1720, and 1725. Cooling surfaces 1710 and 1715 extend orthogonal to a surface 1728 of a charger case 1730 when extended, and when retracted, reside in slots 1735 and 1740 respectively. The cooling surfaces 1710 and 1715 operate in a switchblade manner as indicated by arrows 1745 and 1750.

Cooling surfaces 1720 and 1725 rotate away from case surfaces 1755 and 1760 about hinges 1765 and 1770 in one embodiment. The hinge facilitate motion is indicated by arrows 1775 and 1780.

Figure 18:
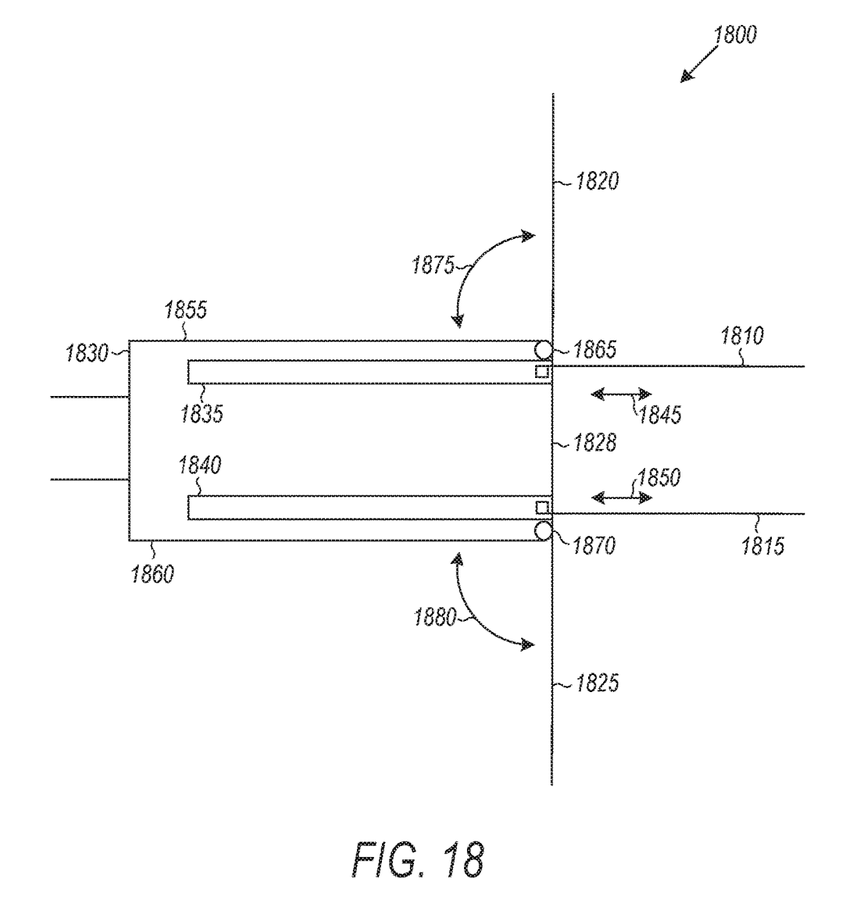
FIG. 18 is a top view representation of a charger illustrating a combination of different types of cooling surfaces according to an example embodiment.

FIG. 18 is a top view representation of a charger 1800 illustrating a combination of different types of cooling surfaces 1810, 1815, 1820, and 1825. Cooling surfaces 1810 and 1815 extend orthogonal to a surface 1828 of a charger case 1830 when extended, and when retracted, reside in slots 1835 and 1840 respectively. The cooling surfaces 1810 and 1815 operate in a switchblade manner as indicated by arrows 1845 and 1850.

Cooling surfaces 1820 and 1825 rotate away from case surfaces 1855 and 1860 about hinges 1865 and 1870 in one embodiment. The hinge facilitate motion is indicated by arrows 1875 and 1880.

Figure 19:
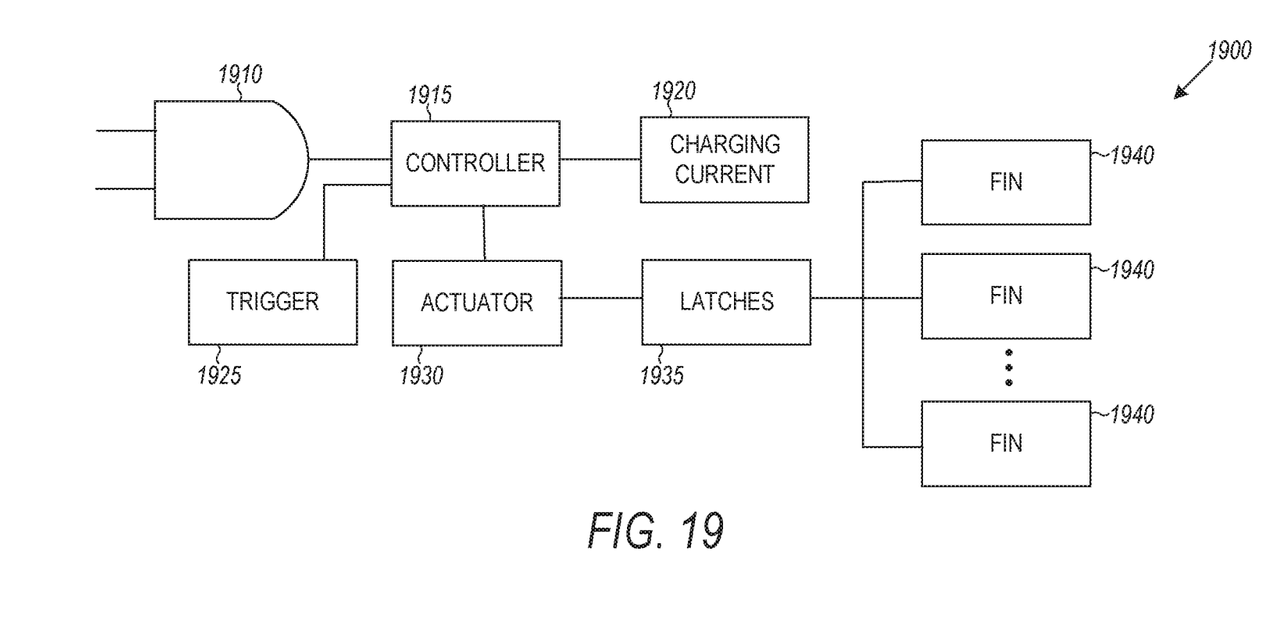
FIG. 19 is a block schematic diagram representation of a charger with retractable cooling surfaces according to an example embodiment.

FIG. 19 is a block schematic diagram of a charger 1900. Charger 1900 includes a connector 1910 to couple to an outlet to provide electricity. A controller 1915 is coupled to the connector 1910 and contains circuitry to convert the electricity to a charging current 1920 as in most chargers. In one embodiment, the controller 1915 is coupled to a trigger 1925 that is actuated responsive to the connector 1910 being plugged into the outlet. In some embodiments, the trigger is a mechanical trigger that closes a switch detectible by the controller 1915. In further embodiments, the trigger 1915 comprises logic circuitry or code within controller 1915. Responsive to power being provided to the controller 1915, controller 1915 executes the code or receives a signal from the logic circuitry indicative of the charger 1900 being plugged into an outlet. The controller then controls an actuator 1930 to release one or more latches 1935, which release one or more cooling surfaces, referred to as fins 1940. In some embodiments, latches 1935 may correspond to a motorized gear that operates to both extend and retract the fins 1940. Retraction may be performed responsive to the charger 1900 being unplugged or placed in a reduced power mode by lack of load coupled to the charging current 1920. The controller 1915 may include a charge storage element, such as a super capacitor, that stores sufficient charge to power the motorized gear to retract the one or more fins 1940 upon the charger 1900 being unplugged.

Additional embodiments are found in the following examples:

EXAMPLE 1

A device comprising:
a charger case;
charging electronics supported within the case;
an electrical connector coupled to the charging electronics for coupling to a power source; and
a cooling element coupled to the charger case and extendable to an extended position from the case such that a cooling surface area of the charger case is increased.

EXAMPLE 2

The device of example 1 wherein the cooling element comprises a passive planar surface.

EXAMPLE 3

The device of any one of examples 1-2 wherein the planar surface comprises a first hinged fin rotatable about a first hinge coupled to the charger case from a position coplanar and adjacent to a first surface of the charger case to a position extending at an angle greater than zero from the first surface.

EXAMPLE 4

The device of any one of examples 1-3 wherein the planar surface comprises a second hinged fin rotatable about a second hinge coupled to the charger case from a position coplanar and adjacent to a second surface of the charger case to a position extending at an angle greater than zero from the second surface.

EXAMPLE 5

The device of any one of examples 1-4 wherein the planar surface comprises a first fin extendible from within the charger case to a position extending orthogonally from a first surface of the charger case.

EXAMPLE 6

The device of any one of examples 1-5 wherein the planar surface comprises a second fin extendible from within the charger case to a position extending orthogonally from a second surface of the charger case.

EXAMPLE 7

The device of any one of examples 1-6 wherein a volume of the device with the cooling element extended is substantially the same as a volume of the device with the cooling element in a retracted position.

EXAMPLE 8

The device of any one of examples 1-7 and further comprising a trigger coupled to the cooling element, the trigger configured to extend the cooling element when actuated.

EXAMPLE 9

The device of any one of examples 1-8 wherein the trigger is supported by the case such that coupling the electrical connector to the alternating current power source actuates the trigger to extend the cooling element.

EXAMPLE 10

The device of any one of examples 1-9 wherein the extendible fin comprises a sleeve extendable from a first end of the charger case opposite a second end supporting the electrical connector.

EXAMPLE 11

A device comprising:
a charger case;
charging electronics supported within the case;
an electrical connector coupled to the charging electronics and positioned on a first end of the charger case configured to couple to a power socket to access a power source; and
a cooling element coupled to the charger case and extendable from a retracted position to an extended position.

EXAMPLE 12

The device of example 11 wherein the cooling element increases a device cooling surface area from the extended position to passively disperse heat generated by the charging electronics.

EXAMPLE 13

The device of any one of examples 11-12 wherein the cooling element comprises multiple cooling elements each cooling element extendible from a different retracted position to an extended position.

EXAMPLE 14

The device of any one of examples 11-13 wherein at least one of the cooling elements comprises a hinged fin rotatable about a hinge coupled to the charger case, wherein the retracted position is coplanar and adjacent to a first surface of the charger case and the extended position is a position extending at an angle greater than zero from the first surface.

EXAMPLE 15

The device of any one of examples 11-14 wherein at least one of the cooling elements comprises a fin, wherein the retracted position is within the charger case and the extended position extends orthogonally from a surface of the charger case.

EXAMPLE 16

The device of any one of examples 11-15 wherein a volume of the device with the cooling element extended is substantially the same as a volume of the device with the cooling element in a retracted position.

EXAMPLE 17

The device of any one of examples 11-16 and further comprising a trigger coupled to the cooling element, the trigger configured to extend the cooling element when actuated wherein the trigger is supported by the case such that coupling the electrical connector to the alternating current power source actuates the trigger to extend the cooling element.

EXAMPLE 18

A method comprising:
forming a battery charger case with a collapsible cooling surface, wherein the cooling surface is coupled to the case having a retracted position and an extended position; and
forming a trigger coupled to the charger case and the cooling surface to controllably move the collapsible cooling surface between a retracted position and an extended position.

EXAMPLE 19

The method of example 18 wherein the trigger comprises a mechanical trigger actuated responsive to coupling the battery charger case to a power source via electrical connectors extending from the battery charger case.

EXAMPLE 20

The method of any one of clauses 18-19 wherein the trigger comprises an electrically actuated trigger actuated responsive to coupling the battery charger case to a power source via electrical connectors extending from the battery charger case.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

What is claimed is:
1. A device comprising:
a charger case;
charging electronics supported within the charger case;
an electrical connector coupled to the charging electronics for coupling to a power source; and
a cooling element that is mechanically and thermally coupled to the charger case, and that is extendable to an extended position from the charger case such that a cooling surface area of the charger case is increased, wherein the cooling element comprises a planar surface, wherein the planar surface comprises a first hinged fin rotatable about a first hinge coupled to the charger case from a position coplanar and adjacent to a first surface of the charger case to a position extending at an angle greater than zero from the first surface, and wherein the planar surface comprises a second hinged fin rotatable about a second hinge coupled to the charger case from a position coplanar and adjacent to a second surface of the charger case to a position extending at an angle greater than zero from the second surface.

2. The device of claim 1, wherein the planar surface comprises a first extendable fin that is extendible from within the charger case to a position extending orthogonally from a first surface of the charger case.

3. The device of claim 2, wherein the planar surface comprises a second extendable fin that is extendible from within the charger case to a position extending orthogonally from a second surface of the charger case.

4. The device of claim 1, wherein a volume of the device with the cooling element extended is substantially the same as a volume of the device with the cooling element in a retracted position.

5. The device of claim 1, and further comprising a trigger coupled to the cooling element, the trigger configured to extend the cooling element when actuated.

6. The device of claim 5, wherein the trigger is supported by the charger case such that coupling the electrical connector to an alternating current power source actuates the trigger to extend the cooling element.

7. The device of claim 2, wherein the first extendible fin comprises a sleeve extendable from a first end of the charger case opposite a second end supporting the electrical connector.

8. A device comprising:
a charger case;
charging electronics supported within the charger case;
an electrical connector coupled to the charging electronics and positioned on a first end of the charger case configured to couple to a power socket to access a power source; and
a cooling element that is mechanically and thermally coupled to the charger case, and that is extendable from a retracted position to an extended position,
wherein the cooling element comprises a planar surface, wherein the planar surface comprises a first hinged fin rotatable about a first hinge coupled to the charger case from a position coplanar and adjacent to a first surface of the charger case to a position extending at an angle greater than zero from the first surface, and wherein the planar surface comprises a second hinged fin rotatable about a second hinge coupled to the charger case from a position coplanar and adjacent to a second surface of the charger case to a position extending at an angle greater than zero from the second surface.

9. The device of claim 8, wherein the cooling element increases a device cooling surface area from the extended position to passively disperse heat generated by the charging electronics.

10. The device of claim 8, wherein a volume of the device with the cooling element extended is substantially the same as a volume of the device with the cooling element in a retracted position.

11. The device of claim 8, further comprising:
a trigger coupled to the cooling element, the trigger configured to extend the cooling element when actuated wherein the trigger is supported by the charger case such that coupling the electrical connector to an alternating current power source actuates the trigger to extend the cooling element.

12. A method comprising:
forming a battery charger case with a cooling element, wherein the cooling element is mechanically and thermally coupled to the battery charger case, wherein the cooling element comprises a planar surface, wherein the planar surface comprises a first hinged fin rotatable about a first hinge coupled to the battery charger case from a position coplanar and adjacent to a first surface of the battery charger case to a position extending at an angle greater than zero from the first surface, and wherein the planar surface comprises a second hinged fin rotatable about a second hinge coupled to the battery charger case from a position coplanar and adjacent to a second surface of the battery charger case to a position extending at an angle greater than zero from the second surface; and
forming a trigger coupled to the battery charger case and the planar surface to controllably move the planar surface between a retracted position and an extended position.

13. The method of claim 12, wherein the trigger comprises a mechanical trigger actuated responsive to coupling the battery charger case to a power source via electrical connectors extending from the battery charger case.

14. The method of claim 12, wherein the trigger comprises an electrically actuated trigger actuated responsive to coupling the battery charger case to a power source via electrical connectors extending from the battery charger case.

* * * * *